(12) United States Patent
Kurth et al.

(10) Patent No.: US 7,099,212 B2
(45) Date of Patent: Aug. 29, 2006

(54) EMBEDDED ROM DEVICE USING SUBSTRATE LEAKAGE

(75) Inventors: Casey Kurth, Eagle, ID (US); Scott Derner, Meridian, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 10/924,309

(22) Filed: Aug. 23, 2004

(65) Prior Publication Data

US 2005/0018508 A1    Jan. 27, 2005

Related U.S. Application Data

(62) Division of application No. 10/194,549, filed on Jul. 11, 2002, now Pat. No. 6,781,867.

(51) Int. Cl.
*G11C 7/00* (2006.01)

(52) U.S. Cl. .................................. 365/203; 365/185.25
(58) Field of Classification Search ................ 365/203, 365/185.25
See application file for complete search history.

(56) References Cited

U.S. PATENT DOCUMENTS

| | | | |
|---|---|---|---|
| 4,575,819 A | 3/1986 | Amin | |
| 4,855,803 A | 8/1989 | Azumai | |
| 5,053,648 A | 10/1991 | van den Elshout | |
| 5,148,391 A | 9/1992 | Zagar | |
| 5,270,241 A | 12/1993 | Dennison | |
| 5,351,213 A | 9/1994 | Nakashima | |
| 5,388,076 A | 2/1995 | Ihara | |
| 5,418,739 A | 5/1995 | Takasugi | |
| 5,526,302 A | 6/1996 | Takasugi | |
| 5,732,013 A | 3/1998 | Von Basse | |
| 5,757,690 A | 5/1998 | McMahon | |
| 5,831,892 A | 11/1998 | Thewes | |
| 5,900,008 A | 5/1999 | Akao | |
| 5,914,901 A * | 6/1999 | Pascucci | 365/203 |
| 5,917,744 A | 6/1999 | Kirihata | |
| 5,961,653 A | 10/1999 | Kalter | |
| 5,966,315 A | 10/1999 | Muller | |
| 5,982,682 A | 11/1999 | Nevill | |
| 5,995,409 A | 11/1999 | Holland | |
| 6,134,137 A | 10/2000 | Kurth | |
| 6,154,864 A | 11/2000 | Merritt | |
| 6,243,285 B1 | 6/2001 | Kurth | |
| 6,266,272 B1 | 7/2001 | Kirihata | |
| 6,507,516 B1 | 1/2003 | Bergemont | |
| 6,545,899 B1 | 4/2003 | Derner et al. | |
| 6,569,742 B1 | 5/2003 | Taniguchi et al. | |
| 6,613,628 B2 | 9/2003 | Zheng et al. | |
| 6,621,737 B2 * | 9/2003 | Naura et al. | 365/185.18 |
| 6,665,207 B2 | 12/2003 | Wald et al. | |
| 6,829,166 B2 * | 12/2004 | Lin et al. | 365/185.18 |

* cited by examiner

*Primary Examiner*—Tuan T. Nguyen
(74) *Attorney, Agent, or Firm*—Leffert Jay & Polglaze, P.A.

(57) ABSTRACT

A ROM embedded DRAM provides ROM cells that can be programmed to a single state. The ROM cells include capacitors having a storage node. The storage node is processed to have a substantially high substrate leakage. The ROM cells, therefore, are hard programmed to a logic zero state. Bias techniques can be used to read un-programmed ROM cells accurately. As described, sense amplifier circuitry can be offset in one embodiment to default to the un-programmed state. In another embodiment, bias circuitry is coupled to bit lines to favor the un-programmed state. A differential pre-charge operation can also be used in another embodiment.

18 Claims, 7 Drawing Sheets

EMBEDDED ROM DEVICE USING SUBSTRATE LEAKAGE

RELATED APPLICATIONS

This is a divisional application of U.S. patent application Ser. No. 10/194,549, titled "EMBEDDED ROM DEVICE USING SUBSTRATE LEAKAGE," filed Jul. 11, 2002, now U.S. Pat. No. 6,781,867 issued on Aug. 24, 2002, which application is assigned to the assignee of the present invention and the entire contents of which are incorporated herein by reference.

TECHNICAL FIELD OF THE INVENTION

The present invention relates generally to memory devices and in particular the present invention relates to read only memory (ROM) embedded in a dynamic random access memory (DRAM).

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array.

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor. The capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the transistor is activated and sense amplifiers coupled to bit lines (column) determine the level of charge stored in the memory cell capacitor, and reads the charge out as either a "1" or a "0" depending upon the level of charge in the capacitor. In a write operation, the sense amplifier is overpowered and the memory cell capacitor is charged to an appropriate level.

Frequently, as in the case of microprocessors, microcontrollers, and other application specific integrated circuitry (ASICs), it is desired to incorporate read only memory (ROM) together with or in addition to RAM on a single semiconductor wafer. This typically requires the formation of separate additional peripheral circuitry and interconnects for the ROM. The ROM cells and additional circuitry require additional semiconductor wafer space and fabrication process steps that increase the overall costs of device fabrication.

A read only memory (ROM) consists of an array of semiconductor devices (diodes, bipolar or field-effect transistors), which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit, which is expensive and feasible only when a large quantity of the same data array is required. EPROMs use a special charge-storage mechanism to enable or disable the switching elements in the memory array. In this case, appropriate voltage pulses to store electrical charges at the memory array locations are provided. The data stored in this manner is generally permanent until it is erased using ultraviolet light allowing it to once again be programmed. PROMs are typically manufactured with all switching elements present in the array, with the connection at each row-column intersection being made by means of either a fuse element or an anti-fuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

Programmable links have been used extensively in programmable read only memory (PROM) devices. Probably the most common form of programmable link is a fusible link. When a user receives a PROM device from a manufacturer, it usually consists of an X-Y matrix or lattice of conductors or semiconductors. At each cross-over point of the lattice a conducting link, call a fusible link, connects a transistor or other electronic node to this lattice network. The PROM is programmed by blowing the fusible links to selected nodes and creating an open circuit. The combination of blown and unblown links represents a digital bit pattern of ones and zeros signifying data that the user wishes to store in the PROM. By providing an address the data stored on a node may be retrieved during a read operation.

In recent years, a second type of programmable link, call an anti-fuse link, has been developed for use in integrated circuit applications. Instead of the programming mechanism causing an open circuit as in the case with fusible links, the programming mechanism in an anti-fuse circuit creates a short circuit or relatively low resistance link. Thus the anti-fuse link presents an open circuit prior to programming and a low resistance connection after programming. Anti-fuse links consist of two electrodes comprised of conductive and/or semiconductive materials and having some kind of a dielectric or insulating material between them. During programming, the dielectric in between the conductive materials is broken down by predetermined applied voltages, thereby electrically connecting the conducting and/or semiconducting materials together.

Like RAM cells, ROM cells need to store either a data 1 or a data 0. Processing factors, however, may limit the ROM cell to only one program state. For the reasons stated above, and for other reasons stated below which will become apparent to those skilled in the art upon reading and understanding the present specification, there is a need in the art for a ROM-embedded-DRAM which can be fabricated with single state ROM cells.

SUMMARY OF THE INVENTION

The above-mentioned problems with ROM-embedded-DRAM and other problems are addressed by the present invention and will be understood by reading and studying the following specification.

In one embodiment, a memory device comprises an array of dynamic memory cells and an array of read only memory (ROM) cells. Each dynamic memory cell comprises a storage capacitor having a first plate to store an electrical charge. Each ROM cell comprises a storage capacitor having a first plate coupled to discharge an electrical charge such that the dynamic memory cells retain a charge substantially longer than the ROM cells.

In another embodiment, an integrated circuit ROM embedded DRAM comprises an array of dynamic memory cells and an array of read only memory (ROM) cells. Each dynamic memory cell comprises a storage capacitor having a storage plate coupled to first active area regions of a substrate. The first active area regions and the substrate have opposite electrical doping such that a first substrate leakage current from the first active area regions to the substrate is small to retain a charge on the storage plate. Each ROM cell comprises a storage capacitor having a storage plate coupled to second active area regions of a substrate. The second active area regions are doped such that a second substrate leakage current from the second active area regions to the substrate is greater than the first substrate leakage current to discharge the second storage places substantially faster than the first storage plates.

A method of programming an integrated circuit read only memory (ROM) cell is provided and comprises implanting N+ material into a P-substrate to form an active area, implanting a P-type material into the active area to enhance a leakage current from the active area to the substrate, and forming a cell capacitor having a storage plate electrically coupled to the active area.

DETAILED DESCRIPTION OF THE INVENTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 1:
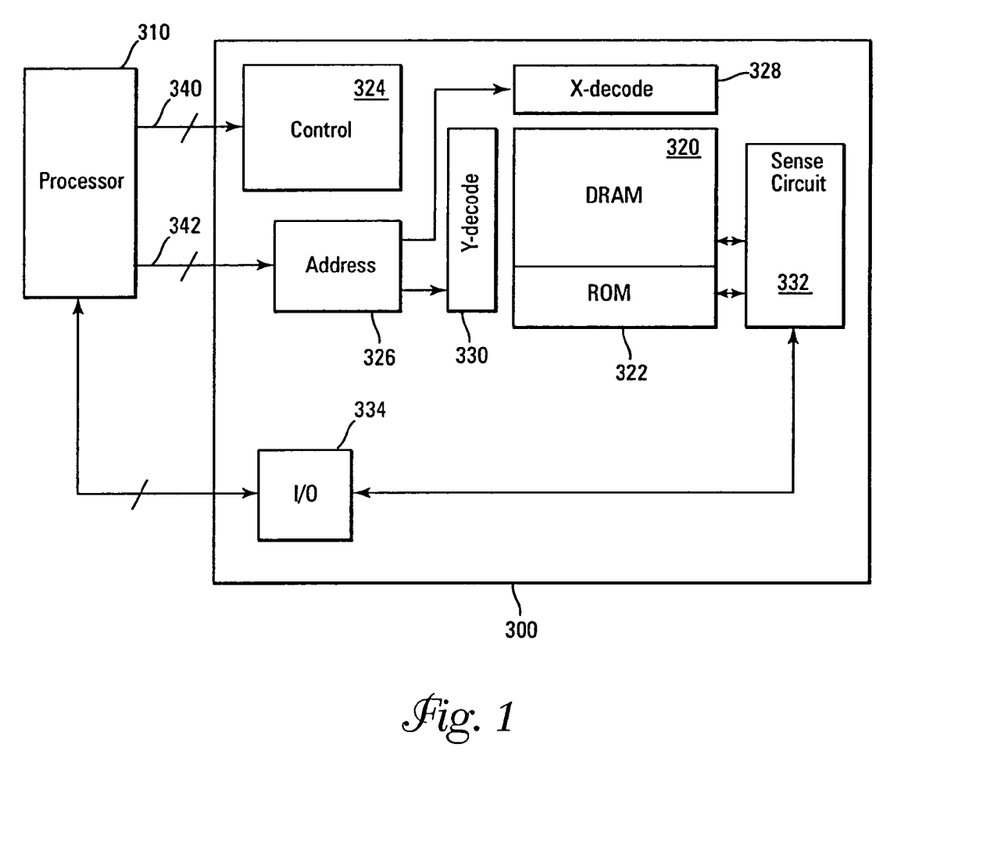
FIG. 1 is a simplified block diagram of a ROM embedded DRAM of an embodiment of the present invention.

Referring to FIG. 1, a simplified block diagram of a ROM embedded DRAM 300 of the present invention is described. The memory device can be coupled to a processor 310 for bi-directional data communication. The memory includes an array of memory cells 312. The array includes a dynamic (DRAM) portion 320 and a read only (ROM) portion 322. The ROM array is "embedded" in the dynamic memory and may include some dynamic cells. Control circuitry 324 is provided to manage data storage and retrieval from the array in response to control signals 340 from the processor. Address circuitry 326, X-decoder 328 and Y-decoder 330 analyze address signals 342 and storage access locations of the array. Sense circuitry 332 is used to read data from the array and couple output data to I/O circuitry 334. The I/O circuitry operates in a bi-directional manner to receive data from processor 310 and pass this data to array 312. It is noted that the sense circuitry may not be used in some embodiments to store the input data.

Dynamic memories are well known, and those skilled in the art will appreciate the that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded memory.

One technique for physically programming ROM embedded cells is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to Vcc or Vss by shorting the cell to wordlines. The memory reads the ROM cells in a manner that is identical to reading the DRAM cells. As described below, the present invention provides an improved ROM embedded DRAM.

As explained above, conventional ROM devices program two data states, logic 1 and 0. When the memory cells are read, therefore, both data states are readily available. In contrast, the present invention provides a combination ROM and DRAM memory device. The ROM memory cells are programmed to one data state, while the DRAM memory cells are programmed and refreshed to a complimentary data state. This can be accomplished by shorting selected cells to one voltage and programming all cells to a complementary state. The cells that are shorted remain programmed in a non-volatile manner, while the remaining cells are programmed to the complimentary state in a volatile manner. For example, ROM memory cells can be programmed to a ground potential state (logic 0) by discharging the DRAM memory cell to the substrate, as explained below. The ROM cells are pre-programmed prior to operation to a logic 1 value, for example Vcc. The cells that are hard programmed to a logic 0 state return to a logic 0 state, while the remaining cells are dynamically programmed to logic 1.

In an alternative embodiment, the ROM embedded DRAM can include sense amplifier circuitry that is biased to read an un-programmed DRAM cell as a logic 1 (charged). As such, a programmed ROM having a high cell leakage is read as a logic 0 and the remaining un-programmed DRAM cells are read as a one. After describing ROM hard programming using cell leakage, bias techniques for sensing unprogrammed cells are explained.

Figure 2:
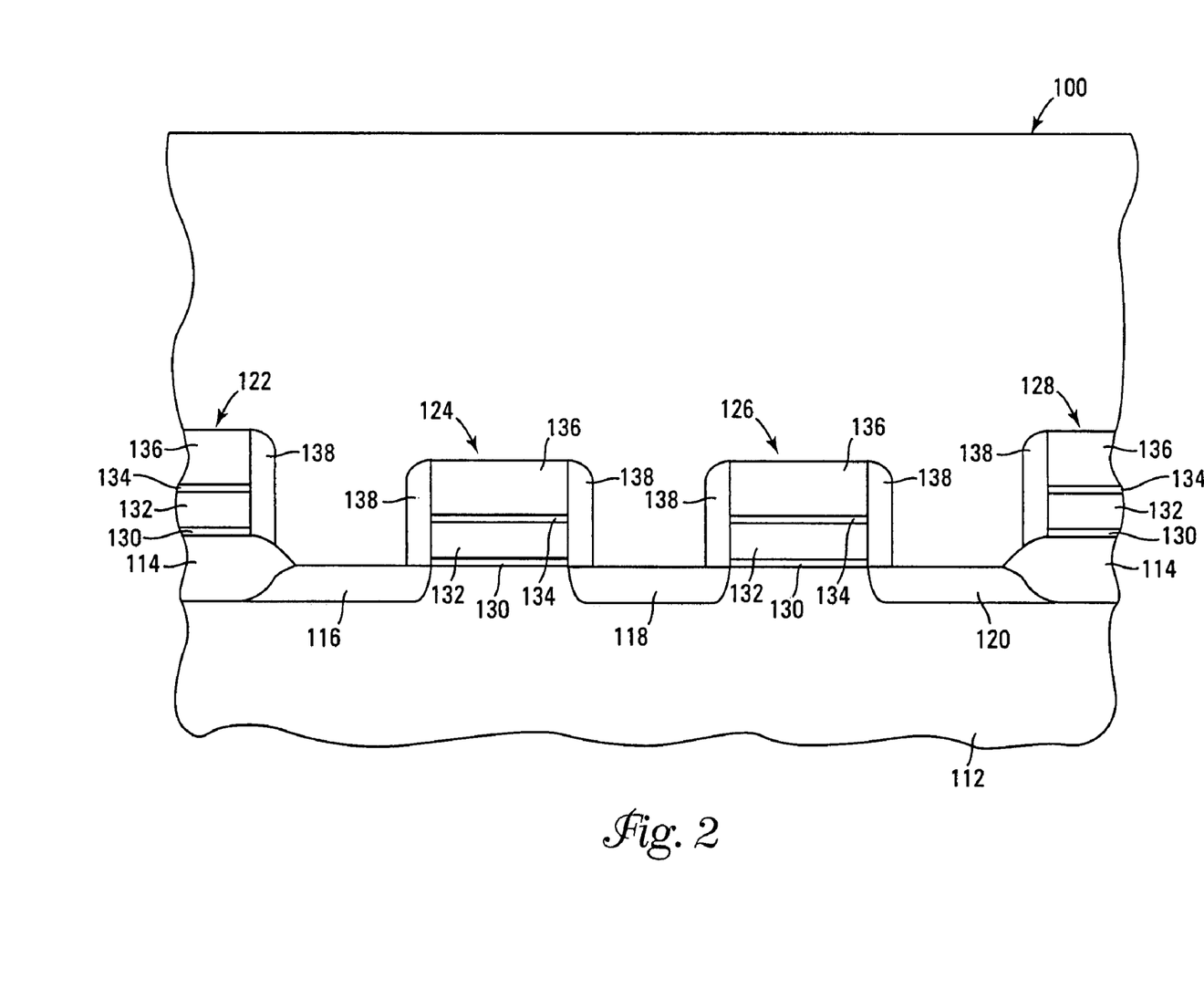
FIG. 2 is a cross-section of a fabrication of a ROM-embedded-DRAM of an embodiment of the present invention.

Referring now to FIG. 2, a semiconductor wafer cross section at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each wordline consists of a lower gate oxide 130, a lower poly layer 132, a higher conductivity silicide layer 134 and an insulating silicon nitride cap 136. Each wordline has also been provided with insulating spacers 138, which are also composed of silicon nitride.

Two FETs are depicted in FIG. 2. One FET is comprised of two active areas (source/drain) 116, 118 separated to form a channel region and one wordline (gate) 124. The second FET is comprised of two active areas (source/drain) 118, 120 and a second wordline (gate) 126. The active area 118 common to both FETs is the active area over which a bit line contact will be formed. One bit line contact is shared by two DRAM cells to conserve space.

Active areas 116, 118 and 120 are formed by an implant operation. In one embodiment, the substrate is a P-type substrate, or well, and the active areas are doped as N+ regions. In standard DRAM fabrication, the cell active areas are created to reduce leakage to the substrate. That is, the active areas form a PN diode junction with the substrate. This diode junction is typically controlled to minimize leakage from the DRAM cell and extend data retention times. In contrast, the present invention weakens the diode junction to hard program a ROM cell. In one embodiment, active area 116 is counter doped with a P-type material. For example, a selective boron implant can be performed on the junction region to provide a weak N-type region. It will be appreciated by those skilled in the art with the benefit of the present invention, that other techniques can be used to increase the leakage of the ROM cell. In one embodiment, the ROM cell has a substrate leakage current that is an order of magnitude greater than the DRAM cell substrate leakage current.

As explained above, one embodiment of reading complimentary memory cell states includes programming all memory cells to a logic 1 charged state. After the ROM and DRAM cells are pre-programmed to a charged state, the hard programmed ROM cells discharge through the weak diode region. It will be appreciated that a fast discharge can increase programming and refresh currents, while a slower discharge time requires more time, following pre-charge, before reading the memory cells. Likewise, a fast discharge may have a slight coupling influence on the substrate voltage.

Figure 3:
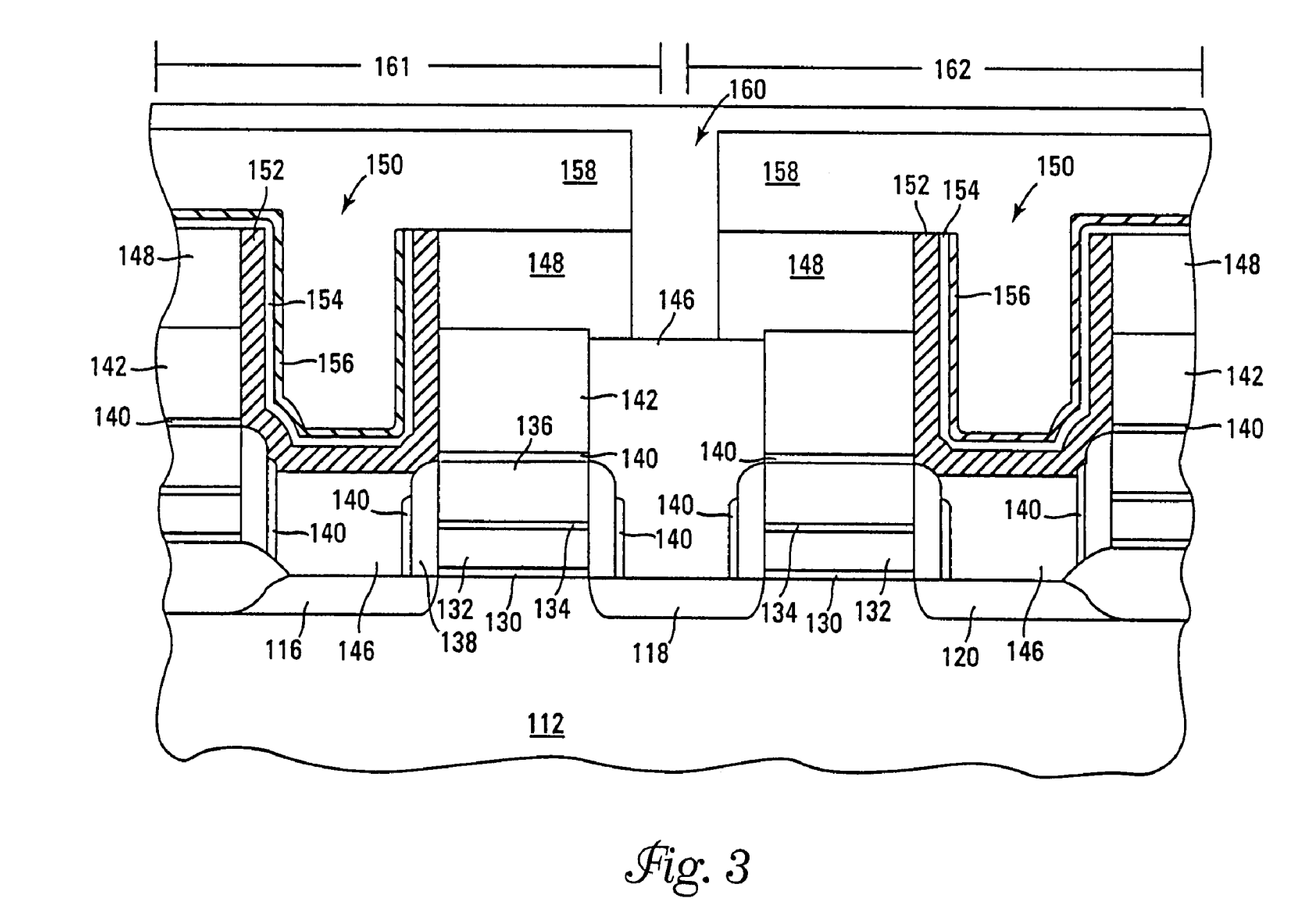
FIG. 3 is another cross-section of the ROM-embedded-DRAM of FIG. 2.

Referring to FIG. 3, the processed ROM embedded DRAM cross-section is further explained. A thin layer 140 of nitride or TEOS (tetraethyl orthosilicate) is provided adjacent to spacers 138 and above nitride cap 136. A layer of insulating material 142 is deposited over layer 140 and cap 136. The insulating material preferably consists of borophosphosilicate glass (BPSG). Conductive plugs 146 are formed in contact with the active areas 116, 118, 120. An example of the material used to form conductive plug layer 146 is in situ arsenic or phosphorous doped poly. An additional layer 148 of BPSG is deposited on insulator 142.

Conductive storage node 152 (lower electrode) of the capacitor is provided. Node 152 may be formed of hemispherical grained poly (HSG) to increase capacitance. If HSG poly is used, the layer 152 may be formed by first depositing a layer of in situ doped polysilicon followed by a deposition of undoped HSG. Subsequent heating inherent in wafer processing effectively conductively dopes the overlying HSG layer. Alternatively, node 152 may be provided by in situ arsenic doping of an entire HSG layer. Node 152 is in electrical contact with plugs 146 over the non-bit line active areas 116, 120. A capacitor dielectric layer 154 is provided over a second BPSG layer 148 and over the conductive node 152. The dielectric layer 154 may comprise a $Ta_2O_5$ or oxide-nitride-oxide (ONO) dielectric, although other materials are of course possible.

A second conductive node 156 is provided over the dielectric layer 154. The second conductive node 156 is preferably composed of poly. In addition to serving as a second plate of the capacitor, the second conductive node 156 also forms the interconnection lines between the second plates of capacitors. A bit line insulating layer 158 is provided over the second conductive layer 156 and the second BPSG layer 148. The bit line insulating layer 158 may be comprised of BPSG. A bit line contact 160 is provided such that the bit line contact is in electrical contact with plug 146. Thus, plug 146 over the active area 118 acts as a bit line contact to ROM cell 161 and DRAM cell 162.

A ROM-embedded-DRAM has been described using a stacked capacitor fabrication technique where the active area of the ROM cell has a relatively large substrate leakage. Various other capacitor structures and fabrication steps may be employed to fabricate capacitors to form ROM cells. Any desired configuration of the ROM-embedded-DRAM according to the invention can be achieved given the teachings herein. Although the process was depicted with reference to a stacked container capacitor process flow, it may be easily adapted to a process utilizing block, trench, double cylindrical, crown shaped, ring or vertical fin capacitors. Such ROM-embedded-DRAM memory cells and arrays can be constructed in accordance with known processing techniques by one of ordinary skill in the art, given the ROM-embedded-DRAM structures and processing techniques taught herein.

The array may then be completed using processing techniques that are well known in the art, including opening holes in the overlaying insulator glass to the polysilicon periphery plugs, metalizing the holes via tungsten plugs or aluminum force fill, and then patterning and etching conductive lines on the surface to form local interconnects. Although only preferred embodiments of the process have been disclosed herein, it will be obvious to those having ordinary skill in the art that changes and modifications may be made to the process without departing from the scope and spirit of the invention as claimed. For example, the process of the invention may be performed to fabricate arrays having straight-line, as opposed to the S-shaped. Similarly, other dielectric materials such as silicon dioxide, titanium oxide, yttrium oxide, barium strontium titanate, combinations of these, and others, may be used for dielectric 154, and other insulating materials, such as the above and various other oxides, may be substituted for the BPSG of layer 142. Additionally, materials other than HSG or CHSG (e.g., cylindrical grain poly (CGP)) may be substituted for rugged polysilicon layer.

Figure 4:
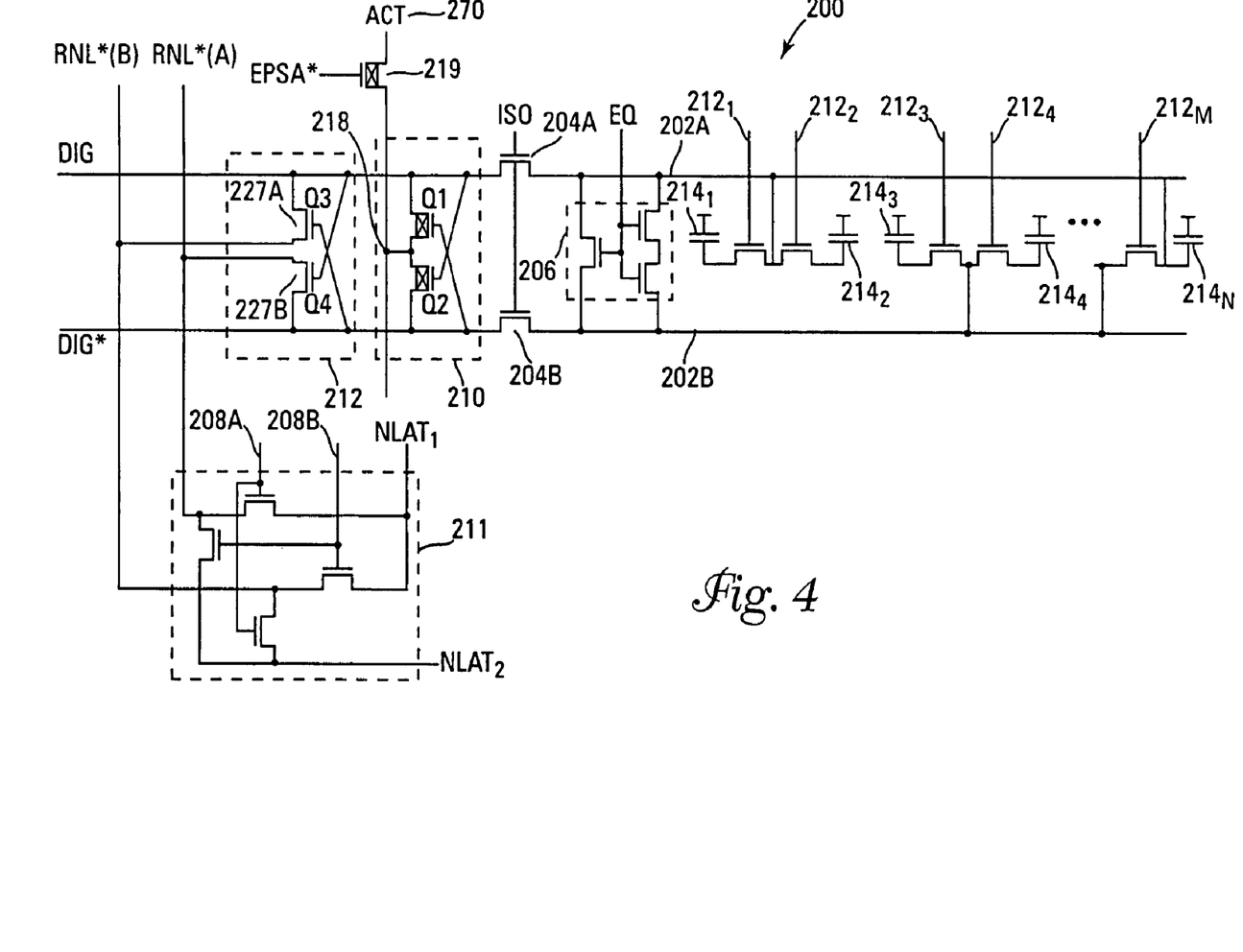
FIG. 4 illustrates a pair of complementary digit lines of the memory of FIG. 1.

FIG. 4 illustrates a pair of complementary digit lines, or bit lines 202A and 202B respectively. Specifically, FIG. 4 is a schematic diagram illustrating a detailed portion of a sense amplifier circuit and related auxiliary connection circuitry. The schematic 200 includes an illustration of devices for digit line equilibration shown collectively as 206, a p-sense amplifier 210, as well as an n-sense amplifier 212. The p-sense amplifier 210 includes a pair of cross-coupled p-channel transistors, Q1 and Q2 respectively. A first common node 218 is coupled to the pair of p-channel transistors Q1 and Q2. In one embodiment, common node 218 includes electrical coupling to an active pull-up (ACT) 270 or power voltage supply node through an enable p-sense amplifier (EPSA*) transistor 219. In one embodiment, the ACT 270 couples a Vcc voltage supply to the common node 218. In another embodiment, ACT 270 couples a different bias to common node 218.

The n-sense amplifier 212 includes a pair of cross-coupled n-channel transistors, Q3 and Q4 respectively. The n-sense amplifier 212 and the p-sense amplifier 210 are further coupled to a complementary pair of bitlines, or digitlines 202A and 202B. Memory cells, 214$_1$, . . . , 214$_N$, etc., located at the intersection of digitlines 202A and 202B and wordlines 220$_1$, . . . , 220$_M$. Each n-channel transistor, Q3 and Q4, of the n-sense amplifier is independently coupled to an n-sense amplifier bus line, RNL*A and RNL*B respectively. In operation, the n-sense amplifier bus lines, RNL*A and RNL*B, couple each n-channel transistor, Q3 and Q4, to an n-sense amplifier latch signal, NLAT$_1$, and NLAT$_2$.

The coupling of the NLAT$_1$ and NLAT$_2$ to each n-channel transistor, Q3 and Q4 is controlled by a series of gate transistors shown collectively as 211. In one embodiment, the gate transistors are operated by bias, 208A and 208B. The bias signals 208A and 208B are applied in the alternative. Applying bias 208A couples NLAT$_1$ to RNL*A and NLAT$_2$ to RNL*B. Applying bias 208B has the opposite resultant effect. In one embodiment, NLAT$_1$ is at a potential of Vcc/2 (or DVC2) and NLAT$_2$ is at a potential of Vcc/2+ (or DVC2+), slightly greater than DVC2. In one embodiment, DVC2+ is approximately 50 millivolts (mV) higher than the potential of DVC2. These potentials are placed on the respective n-sense amplifier bus lines, RNL*A or RNL*B depending on which bias, 208A or 208B, is selected.

Thus, NLAT is at a potential of DVC2 and NLAT$_2$ is at a potential of DVC2+ when bias 208A is chosen. N-sense amplifier bus lines, RNL* is biased to DVC2 and RNL*B is biased to DVC2+. ACT 270 meanwhile is biased to Vss or signal ground. The digitlines are both initially equilibrated at Vcc/2. Thus, the n-sense amplifier transistors and p-sense amplifier transistors are off. When the memory cell is accessed, a signal develops across the complementary digitline pair. While one digitline contains charge from the cell accessed, the other digitline does not and serves as a reference for the sensing operation.

In operation, the n-sense amplifier is fired by bringing, NLAT$_1$ and NLAT$_2$, toward ground. As the voltage difference between NLAT$_1$ and the reference digitline, and between NLAT$_2$ and digitline and approaches Vt, the n-channel transistor whose gate is connected to the higher voltage digitline begins to conduct. This conduction is further assisted, however, by the fact that NLAT$_1$ with the DVC2 bias pulls to ground more quickly, reaching that transistor's saturation conduction region more rapidly. Thus, even if the signal difference across the complementary digitline pair is not very clear or distinguishable, one of the n-channel transistors is biased to turn on more quickly, favoring a logical "1" read. The remainder of the sensing operation occurs as known to those skilled in the art. The conduction of the n-channel transistor causes the low-voltage digitline to be discharged toward the NLAT* voltage. Ultimately, NLAT* reaches ground, and the digitline is brought to ground potential. The p-sense amplifier is next fired and the ACT 270 is brought toward Vcc in complementary fashion to the n-sense amplifier. With the low-voltage digitline approaching ground, there is a strong signal to drive the appropriate p-channel transistor into conduction.

In an embodiment of the present invention, ROM cells are programmed to one logic state, but not the other. That is, all ROM cells can be programmed to logic zeros and not logic ones. The sense amplifier circuitry is biased to sense the unprogrammed ROM cells as a logic one data state. Thus, the sense amplifiers are biased to pull the active digit line high in the absence of a programmed "zero" memory cell.

The present invention is not limited to the bias circuit described above, but can be any biasing technique which allows the sense amplifier circuitry to favor one data state when the digit lines have a small, or zero, differential voltage. For example, the p-sense amplifier circuit can be biased. Further, both the p-sense and n-sense amplifier circuitry can be biased. In memory devices that use sense circuitry, which differs from the cross-couple circuit described, further biasing circuitry can be used.

The present invention allows an embedded ROM to be fabricated in a DRAM, while programming the ROM cells using only one data state. The above-described embodiment biases the sense amplifier circuitry to accurately read un-programmed memory cells. In other embodiments, digit line voltages are biased using reference memory cells to reliably sense un-programmed ROM cells, as described below.

Figure 5:
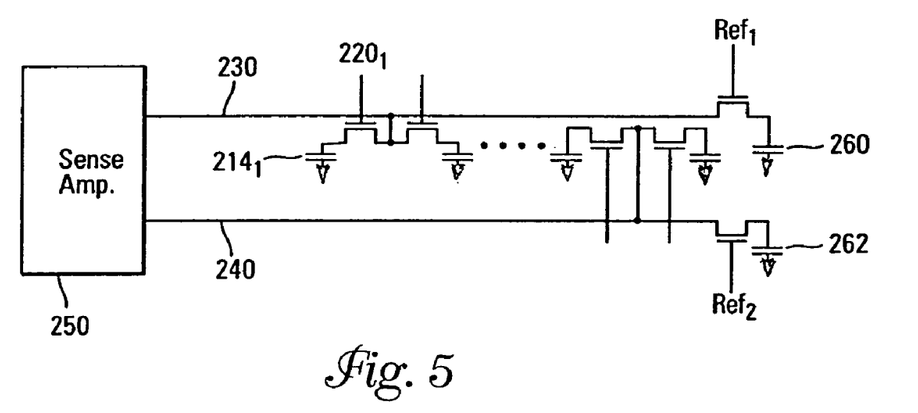
FIG. 5 illustrates a pair of complementary digit lines and reference cells of an embodiment of the memory of FIG. 1.

Referring to FIG. 5, a portion of a ROM array is described. The array includes a pair of digit lines 230 and 240 coupled to a differential voltage sense amplifier circuit 250. Each digit line can be selectively coupled to reference memory cells 260 and 262 to provide a differential between the digit lines. In one embodiment, a reference cell 260 is coupled to the active digit line 230 to bias the digit line toward the un-programmed state. In a complementary embodiment, reference cell 262 is coupled to the reference digit line 240 to bias the reference digit line toward a programmed cell state. The reference cells can be ROM cells coupled to an intermediate voltage level X, such that ½ Vcc<X<Vcc, or Vss<X<½ Vcc. Alternatively, the reference cells can be DRAM capacitor cells that contain an appropriate charge that moves its corresponding digit line voltage.

Figure 6:
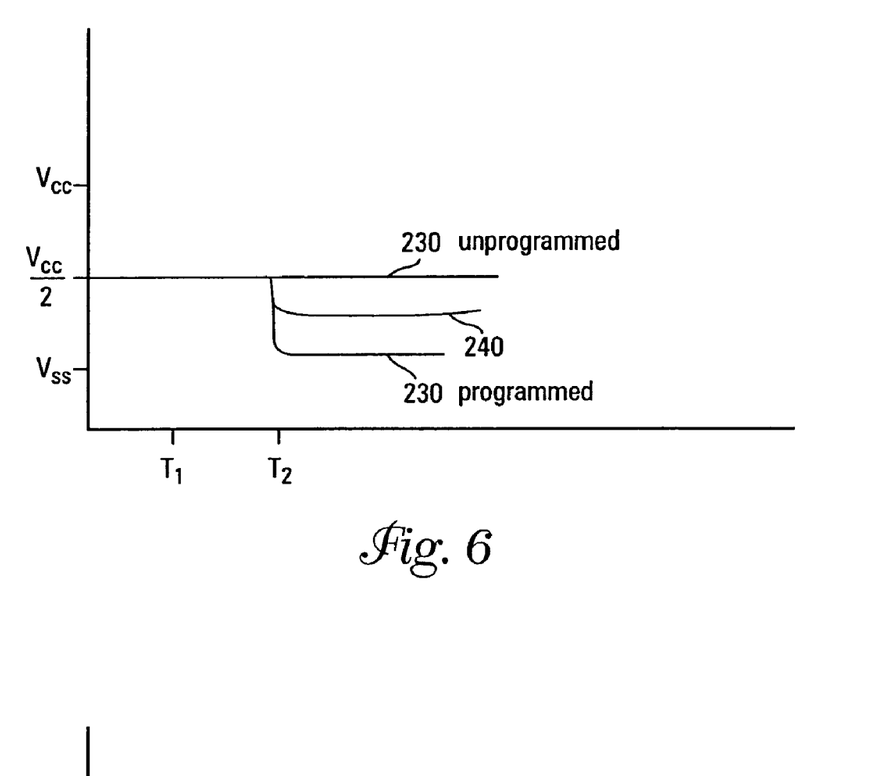
FIG. 6 is a simplified timing diagram of operation of an embodiment of the memory of FIG. 5.

As illustrated in the timing diagram of FIG. 6, at time T1 the bit lines 230 and 240 are equilibrated to ½ Vcc. At time T2, the memory cell wordline 220 is activated. At the same time, the reference wordline $Ref_2$ is activated to couple the reference cell 262 to the reference digit line 240. If the ROM cell is un-programmed (not Vss), the active digit line 230 remains substantially at ½ Vcc and the reference digit line voltage is decreased by un-charged reference cell 262. If the ROM cell is programmed to Vss, the active digit line 230 is pulled to Vss.

Figure 7:
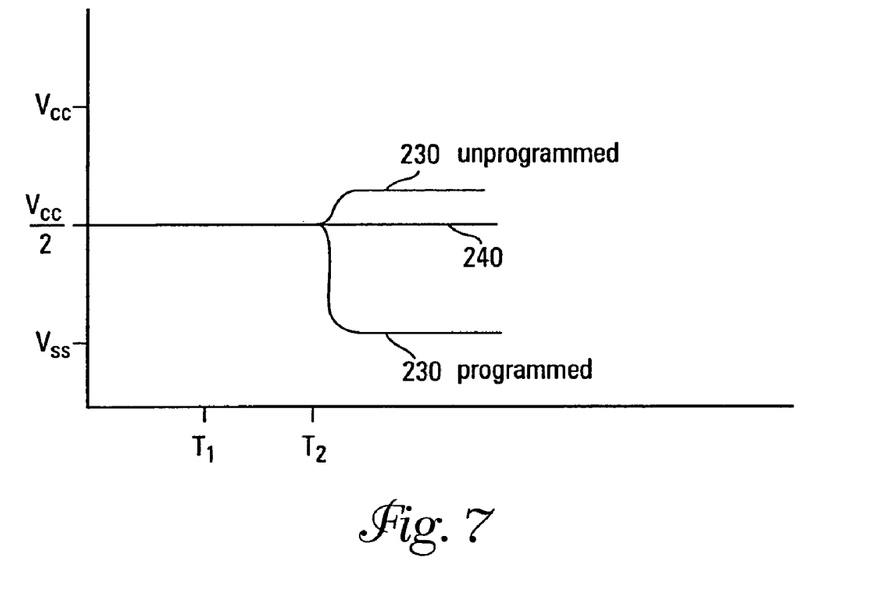
FIG. 7 is another simplified timing diagram of operation of an embodiment of the memory of FIG. 5.

As illustrated in the timing diagram of FIG. 7, at time T1 the bit lines 230 and 240 are equilibrated to ½ Vcc. At time T2, the memory cell wordline 220 is activated. At the same time, the reference wordline $Ref_1$ is activated to couple the reference cell 260 to the active digit line 230. If the ROM cell is un-programmed (not Vss) the active digit line 230 is increased by charged reference cell 260, and the reference digit 240 line voltage remains substantially at ½ Vcc. If the ROM cell is programmed to Vss, the active digit line 230 is pulled to Vss.

It will be appreciated by those skilled in the art, with the benefit of the present disclosure, that activating the ROM cell and the reference cell simultaneously can result in increased power consumption. As such, it may be beneficial to precharge the digit lines to a differential state prior to activating the ROM wordline. In this embodiment, the differential voltage remains present if the ROM cell is unprogrammed. If the ROM cell is programmed, the differential voltage is driven hard in the opposite direction.

In operation of this embodiment, the bias circuit is activated prior to activating the ROM cell wordline. The reference digit line is pre-charged to a mid-level such as ½ Vcc and the active digit line is charged to less than or equal to Vcc, but greater than ½ Vcc, prior to activating the wordline. If the cell is programmed, the active digit line is discharge to ground.

Figure 8:
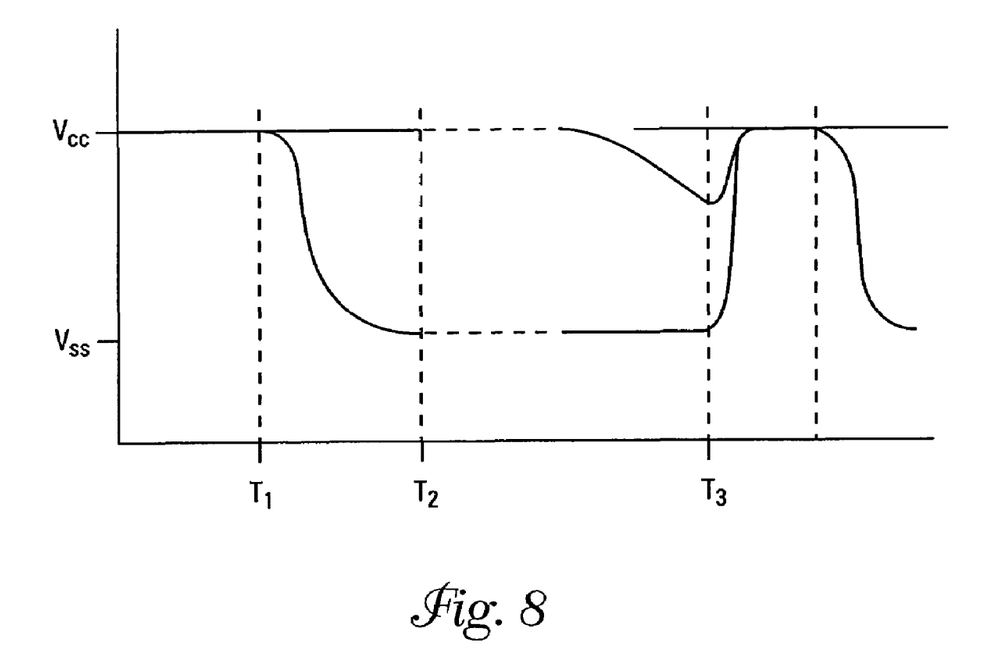
FIG. 8 is a timing diagram of a pre-charge and refresh operation of an embodiment of the memory of FIG. 1.

The above biasing techniques allow for accurate sensing of un-programmed ROM cells. Alternatively, the un-programmed memory cells can be pre-programmed and refreshed in a manner similar to standard DRAM. Referring to FIG. 8, a timing diagram of a single state ROM embedded DRAM is described. In this example, the ROM cell is programmed to Vss using the present substrate cell leakage and un-programmed ROM cells are charged to Vcc. At time T1, the ROM memory cells are coupled to Vcc to pre-charge the cells. The programmed ROM cells are also coupled to Vcc, but return to Vss following pre-charge. The discharge time depends upon the leakage current of the hard programmed ROM cells. As stated above, the ROM cells should not be read until the cells discharge below Vcc. Over a period of time, the un-programmed ROM cell loses the pre-charge and drops in charge. At time T2, the un-programmed ROM cells require a refresh. The refresh operation is substantially the same as the pre-charge operation. Controlling the ROM voltage during pre-program and refresh operations can avoid contention between the programmed ROM cells and the pre-charge voltage.

CONCLUSION

A ROM embedded DRAM has been described that provides ROM cells that can be programmed to a single state. The ROM cells include capacitors having a storage node. The storage node is processed to have a substantially high substrate leakage. The ROM cells, therefore, are hard programmed to a logic zero state. Bias techniques can be used to read un-programmed ROM cells accurately. As described, sense amplifier circuitry can be offset in one embodiment to default to the un-programmed state. In another embodiment, bias circuitry is coupled to bit lines to favor the un-programmed state. A differential pre-charge operation can also be used in another embodiment.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming both volatile and non-volatile data in memory cells comprising:
   coupling a program voltage to a digit line;
   activating a first access transistor to store a charge on a capacitor of a first dynamic memory cell;
   activating a second access transistor to store a charge on a capacitor of a second dynamic memory cell; and
   rapidly discharging the capacitor of the second dynamic memory cell, such that the second dynamic memory cell is discharged while the first dynamic memory cell remains charged.

2. The method of claim 1 wherein the second dynamic memory cell is rapidly discharged through leakage current of the second access transistor.

3. The method of claim 1 further comprises performing a refresh operation to maintain the charge on the first dynamic memory cell.

4. The method of claim 1, wherein programming the second dynamic memory cell comprises:
   forming an active area in an integrated circuit substrate;
   doping the active area to enhance a leakage current from the active area to the substrate; and
   forming a cell capacitor having a storage plate electrically coupled to the active area.

5. The method of claim 4, wherein activating and discharging the second dynamic memory cell comprises:
   coupling a charge to the storage plate to pre-charge the second dynamic memory cell; and
   discharging the storage plate through the active area leakage current.

6. The method of claim 4, wherein the substrate is a p-type material and the active area is an n-type material, wherein doping the active area to enhance a leakage current comprises counter doping the active area with a p-type material.

7. The method of claim 6, wherein the active area is counter doped with boron.

8. The method of claim 4, wherein the cell capacitor is a stacked container capacitor.

9. The method of claim 4, and further comprising:
   forming a second active area in the substrate and separated from the first active area to define a channel region; and
   doping the second active area to enhance leakage current from second active area.

10. The method of claim 1, wherein programming the second dynamic memory cell comprises:
   forming an active area in an integrated circuit substrate;
   counter doping the active area to increase conductivity between the active area and the substrate; and forming a cell capacitor having a storage plate electrically coupled to the active area.

11. The method of claim 1, wherein the substrate is a P-type material and the ROM cell active areas are doped as N+ regions and counter doped with a P-type material.

12. The method of claim 11, and further comprising:
coupling a charge to the storage plate to pre-charge the ROM cell; and
discharging the storage plate through the active area leakage current.

13. The method of claim 12, wherein the substrate is a p-type material and the active area is an n-type material, wherein doping the active area to increase conductivity comprises counter doping the active area with a p-type material.

14. The method of claim 12, wherein the cell capacitor is a stacked container capacitor.

15. The method of claim 12, and further comprising:
forming a second active area in the substrate and separated from the first active to define a channel region; and
doping the second active area to enhance leakage current from second active area.

16. A method of programming both volatile and non-volatile data in memory cells comprising:
coupling a program voltage to a digit line;
activating a first access transistor to store a charge on a capacitor of a first dynamic memory cell;
activating a second access transistor to store a charge on a capacitor of a second dynamic memory cell; and
rapidly discharging the capacitor of the second dynamic memory cell, such that the second dynamic memory cell is discharged while the first dynamic memory cell remains charged;
wherein programming the second dynamic memory cell comprises:
implanting N+ material into a P-substrate to form an active area;
implanting a P-type material into the active area to enhance a leakage current from the active area to the substrate; and
forming a cell capacitor having a storage plate electrically coupled to the active area.

17. The method of claim 16 wherein the P-type material is boron.

18. The method of claim 16 wherein the cell capacitor is a stacked container capacitor.

* * * * *